US012656396B2

(12) United States Patent
GarciaGomez et al.

(10) Patent No.: US 12,656,396 B2
(45) Date of Patent: Jun. 16, 2026

(54) TEST AND/OR MEASUREMENT INSTRUMENT FOR MEASURING AN ELECTRICAL SIGNAL

(71) Applicant: Rohde & Schwarz GmbH & Co. KG, Munich (DE)

(72) Inventors: FranciscoJavier GarciaGomez, Munich (DE); Hela Jedda, Munich (DE); Julian Leyh, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 235 days.

(21) Appl. No.: 18/673,741

(22) Filed: May 24, 2024

(65) Prior Publication Data

US 2025/0362344 A1 Nov. 27, 2025

(51) Int. Cl.
*G01R 31/317* (2006.01)
(52) U.S. Cl.
CPC . *G01R 31/31727* (2013.01); *G01R 31/31709* (2013.01)
(58) Field of Classification Search
CPC ........................... H04B 3/462; H04B 10/2507; H04B 10/0799; H04B 10/697; H04B 10/6971; H04B 10/0795; H04B 17/21; H04B 17/24; H04B 17/309; H04B 7/005; G01R 31/31715; G01R 31/3016; G01R 31/318502; G01R 31/318594; G01R 31/318552; G01R 31/31709; G01R 31/31708; G01R 31/3171; G01R 13/00; G01R 31/31727; G01R 31/3012
See application file for complete search history.

(56) References Cited

U.S. PATENT DOCUMENTS

| | | | | |
|---|---|---|---|---|
| 7,782,932 B2 * | 8/2010 | Payne | .............. | G01R 31/31715 |
| | | | | 375/232 |
| 8,855,179 B1 * | 10/2014 | Saed | ......................... | H04L 1/24 |
| | | | | 375/376 |
| 11,356,304 B1 * | 6/2022 | Fortin | ............... | H04L 25/03949 |
| 11,606,110 B2 * | 3/2023 | Alnabulsi | ......... | H04L 25/03885 |

OTHER PUBLICATIONS

Keysight Technologies: "Infiniium Serial Data Equalization", User's Guide, Jul. 2022; 76 pages.
Tektronix, Inc. "Serial Data Link Analysis Visualizer Software, Printable Application Help" 212 pages.
Teledyne LeCroy, "Operator's Manual: Eye Doctor II Software", May 2013; 45 pages.

* cited by examiner

*Primary Examiner* — Vinh P Nguyen
(74) *Attorney, Agent, or Firm* — CHRISTENSEN O'CONNOR JOHNSON KINDNESS PLLC

(57) ABSTRACT

A test and/or measurement instrument for measuring an electrical signal is described. The test and/or measurement instrument includes a clock recovery circuit, a multiplexer, at least two test point interfaces, and a signal chain including a plurality of equalizers. The test point interfaces are connected to different parts of the signal chain. The multiplexer is connected to the clock recovery circuit and to the test point interfaces such that each test point interface is selectively connectable to the clock recovery circuit via the multiplexer for real-time performance analysis.

20 Claims, 1 Drawing Sheet

TEST AND/OR MEASUREMENT INSTRUMENT FOR MEASURING AN ELECTRICAL SIGNAL

FIELD OF THE DISCLOSURE

Embodiments of the present disclosure relate to a test and/or measurement instrument for measuring an electrical signal, particularly to a test and/or measurement instrument comprising equalizers, a clock recovery circuit, and test point interfaces.

BACKGROUND

In the state of the art, test and/or measurement instruments exist that can be used for performance-analysis techniques using a waveform as well as corresponding timing information. For example, such instruments can generate eye patterns (eye diagrams) or determine jitter of a signal.

Generally, test and/or measurement instruments can include test point interfaces along the signal chain that allow a user to view the waveform of the signal at the selected test point interface. Some test and/or measurement instruments additionally allow a user to perform clock recovery (extraction of timing information) based on the signal at a test point interface of the instrument.

However, existing test and/or measurement instruments have limitations regarding the available choices as to where the electrical signal is tapped along the signal chain and how clock recovery is performed. In addition, many of the options available on these instruments cannot be performed in real time.

Accordingly, there is a need for a test and/or measurement instrument providing a wide range of choices regarding test point interface selection and clock recovery for real-time performance analysis.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

The present disclosure provides examples of a test and/or measurement instrument for measuring an electrical signal. In an embodiment, the test and/or measurement instrument comprises a clock recovery circuit, a multiplexer, at least two test point interfaces, and a signal chain comprising a plurality of equalizers. The test point interfaces are connected to different parts of the signal chain. The multiplexer is connected to the clock recovery circuit and to the test point interfaces such that each test point interface is selectively connectable to the clock recovery circuit via the multiplexer for real-time performance analysis.

Accordingly, a user can choose at which of the test point interfaces the electrical signal should be tapped for recovering timing information from the electrical signal. In particular, the user can choose the test point interface used for clock recovery independently of the test point interface used for tapping the electrical signal itself (i.e. its waveform) for the performance analysis. More details are thus available for the performance analysis. For example, it can be determined how different stages of the signal chain affect the quality of clock recovery, for example by comparing results derived at different test point interfaces.

In an embodiment, the test point interfaces are connected to the clock recovery circuit in a flexible manner via the multiplexer. A user is thus provided with the flexibility to choose any of the test point interfaces for clock recovery. In an embodiment, any of the test point interfaces can be connected to the clock recovery circuit, regardless of which test point interface is used for tapping the electrical signal (the waveform) itself for the performance analysis. Therefore, the user can choose from a number of $n^2$ combinations, where n is the number of test point interfaces, e.g. four combinations in the case of two (n=2) test point interfaces.

For example, the at least two test point interfaces may comprise a first test point interface and a second test point interface. The test and/or measurement instrument may further comprise a first operation mode and a second operation mode. In the first operation mode, a first test point interface is connected with the clock recovery circuit via the multiplexer and a second test point interface is not connected with the clock recovery circuit. In the second operation mode, the second test point interface is connected with the clock recovery circuit via the multiplexer and the first test point interface is not connected with the clock recovery circuit. Hence, the source of the electrical signal for the clock recovery can be switched easily from the first test point interface to the second test point interface, e.g. by changing the respective operation mode of the test and/or measurement instrument.

For instance, a user may select the respective operation mode. Alternatively or additionally, the respective operation mode is automatically selected based on a test procedure and/or a measurement to be performed.

In embodiments, the at least two test point interfaces may comprise a first test point interface and a second test point interface. A first equalizer and a second equalizer may be provided. The second equalizer is located downstream of the first equalizer and the first test point interface is connected upstream of the first equalizer. The second test point interface may be connected downstream of the first equalizer. In particular, the second test point interface is connected upstream of the second equalizer.

Accordingly, a user can choose if the electrical signal should be tapped for clock recovery upstream or downstream of the first equalizer in the signal chain. For example, clock recovery may be performed on the input signal of the instrument via the first test point interface, whilst the electrical signal itself (its waveform) is tapped downstream of the first equalizer. Hence, the input signal in original form and in equalized form may be used jointly for analysis techniques like eye pattern generation or jitter analysis. In an embodiment, a user may inspect how the equalization affects the quality of the clock recovery.

In an embodiment, the at least two test point interfaces may comprise at least three test point interfaces or at least four test point interfaces, to which the multiplexer is connected such that each test point interface is selectively connectable to the clock recovery circuit via the multiplexer for real-time performance analysis. Hence, the electrical signal can be tapped for clock recovery at various points along the signal chain. Additional information is thus made available for the performance analysis.

In an embodiment, the at least two test point interfaces may comprise a third test point interface that is connected downstream of the second equalizer. The electrical signal can thus be tapped downstream of the second equalizer for clock recovery and/or for using the signal itself (its wave-form) for the performance analysis.

Embodiments of the test and/or measurement instrument may comprise at least three equalizers. A second equalizer is located downstream of a first equalizer. Further, a third equalizer is provided that is located downstream of the second equalizer. A first test point interface may be connected upstream of the first equalizer and a second test point interface may be connected downstream of the first equalizer. The second test point interface may be connected upstream of the third equalizer. In particular, the second test point interface is connected upstream of the second equalizer. Accordingly, the instrument allows tapping the electrical signal for clock recovery at various points along the signal chain at different stages of equalization.

Optionally, a fourth test point interface may be connected downstream of the third equalizer. The electrical signal can thus be tapped downstream of the third equalizer for clock recovery and/or for using the signal itself (its waveform) for the performance analysis.

In general, the plurality of equalizers may comprise at least one of a continuous time linear equalizer, a feed forward equalizer, or a decision feedback equalizer. Different types of equalizers may thus be combined for providing advanced and customized signal equalization. For example, the first equalizer may be a continuous time linear equalizer and/or the second equalizer may be a feed forward equalizer.

In an embodiment, the plurality of equalizers may comprise a feed forward equalizer with coefficients selected such that the feed forward equalizer's behavior is equivalent to that of a decision feedback equalizer. An equalization can thus be performed to the electrical signal that is equivalent to an equalization via a decision feedback equalizer.

In the embodiments where at least three equalizers are provided, the third equalizer may be a decision feedback equalizer or the third equalizer may be a feed forward equalizer with coefficients selected such that its behavior is equivalent to that of a decision feedback equalizer. Nonlinear equalization can thus be enabled.

Generally, each of the equalizers may be configured such that it can be individually deactivated or bypassed. Hence, a user can control if and how the instrument equalizes the electrical signal.

In embodiments, the signal chain may further comprise a slicer connected to the clock recovery circuit such that eye pattern acquisition is enabled. Thus, the electrical signal can be monitored for signal distortion. For example, effects of channel noise, dispersion, and inter-symbol interference, ISI, can be detected.

According to an aspect of the present disclosure, the equalizers may be, for example, real-time equalizers. The instrument can thus perform the equalization of the electrical signal in real time.

In an embodiment, the multiplexer may be a real-time multiplexer. Additionally or alternatively, the clock recovery circuit may be a real-time clock recovery circuit. Real-time performance analysis, e.g. eye pattern generation of jitter analysis, can thus be enabled.

In embodiments, the clock recovery circuit may be made of a hardware means, e.g., hardware circuits comprising digital and/or analog circuits. Real-time clock recovery can thus be enabled. In an embodiment, the clock recovery circuit is operated without any software running thereon. Additionally and/or alternatively the multiplexer may be made of a hardware means, for example without any software running thereon.

According to one aspect, the signal chain may comprise a real-time path and a post-processing path, wherein the clock recovery circuit is provided in the real-time path. In an embodiment, at least one real-time equalizer is provided in the real-time path. Accordingly, clock recovery can be performed in real time, including the equalization chosen to be performed on the signal to be used for clock recovery. In particular, data loss caused by long settling times can be avoided.

In an embodiment, the test and/or measurement instrument may be configured to store an acquired waveform without equalization in an acquisition storage, wherein at least one post-processing equalizer configured for processing the acquired waveform is provided in the post-processing path. Hence, more complex equalization can be implemented in the post-processing path, for example equalization that cannot be implemented in the real-time path. Moreover, a user can thus be enabled to select the test point interface to be used for providing the waveform retrospectively. The user can further be enabled to simultaneously display the waveforms as provided at different test point interfaces based on the same input signal. The post-processing path can optionally include software processing.

As an example, the test and/or measurement instrument may be an oscilloscope configured for emulating a receiver. The user is thus enabled to view and analyze the electrical signal received by the emulated receiver at each of the at least two test point interfaces. In addition, the user can independently choose at which of the test point interfaces the electrical signal should be tapped for clock recovery.

In an embodiment, the emulated receiver is a serial communication data receiver. Typically, serial data transmission over a communication channel, for example with high speed, introduces signal distortions. The problem can be mitigated in a receiver by applying equalization to the distorted electrical signal. The plurality of equalizers of the test and/or measurement instrument can serve as equalizers of the emulated receiver.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
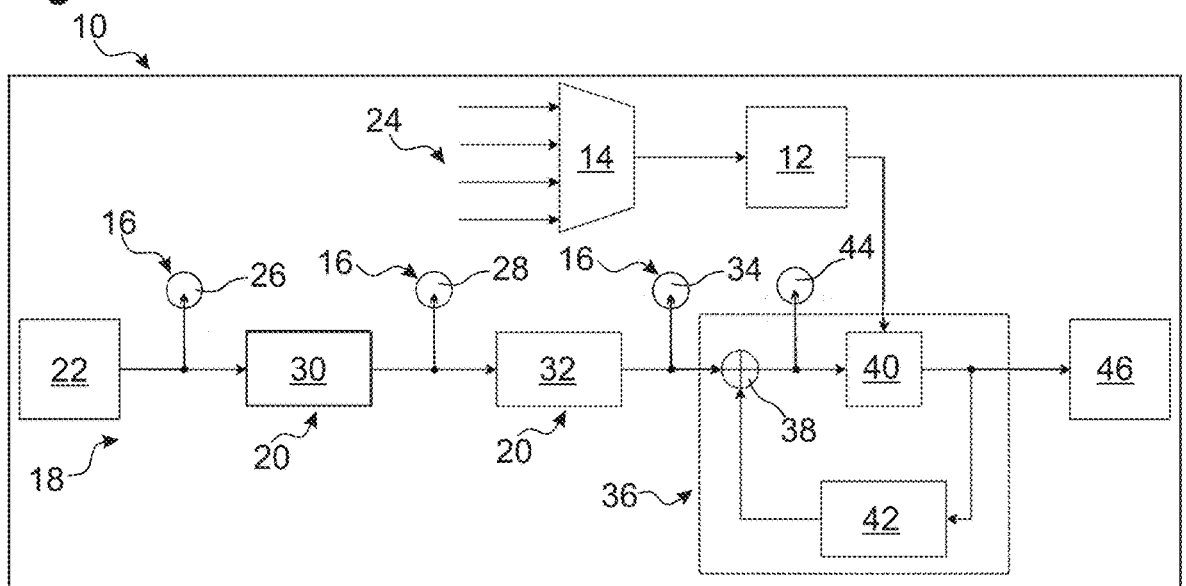
FIG. 1 is a block diagram schematically illustrating a test and/or measurement instrument according to an embodiment of the present disclosure.

FIG. 1 is a block diagram schematically illustrating a test and/or measurement instrument 10 for measuring an electrical signal according to an embodiment of the present disclosure. As it is the case in this example embodiment, the test and/or measurement instrument 10 may be an oscilloscope, for example an oscilloscope configured for emulating a receiver. Operational characteristics of the emulated receiver can thus be analyzed via the oscilloscope. In an embodiment, the emulated receiver is a serial communication data receiver.

As shown in the embodiment of FIG. 1, the test and/or measurement instrument 10 comprises a clock recovery circuit 12 as well as a multiplexer 14 connected with the clock recovery circuit 12. Further, the test and/or measurement instrument 10 comprises at least two test point interfaces 16 which are connected with the multiplexer 14. Moreover, the test and/or measurement instrument 10 has a signal chain 18 comprising a plurality of equalizers 20. In particular, the signal chain 18 starts at a front end 22 of the test and/or measurement instrument 10.

Generally, each of the equalizers 20 may be configured such that it can be individually deactivated or bypassed. Hence, a user can control if and how the test and/or measurement instrument 10 equalizes the electrical signal.

In an embodiment, the test point interfaces 16 are also connected to different parts of the signal chain 18 as shown in FIG. 1. As already mentioned above, the multiplexer 14 is connected to the clock recovery circuit 12 and to the test point interfaces 16 such that each test point interface 16 is independently and selectively connectable to the clock recovery circuit 12 via the multiplexer 14 for real-time performance analysis, e.g. due to a setting of the multiplexer 14. In other words, the multiplexer 14 can be controlled so as to connect one of the test point interfaces 16 with the clock recovery circuit 12 in a selectable manner.

In other words, the test point interfaces 16 are connected to the clock recovery circuit 12 in a flexible manner via the multiplexer 14. A user is thus provided with the flexibility to choose any of the test point interfaces 16 for clock recovery.

In the simplified illustration provided in FIG. 1, the respective paths connecting the test point interfaces 16 with the multiplexer 14 are not shown in full for reasons of simplicity. Instead, the connection paths are represented by the depicted arrows 24 pointing at the multiplexer 14.

As shown in FIG. 1, the at least two test point interfaces 16 may comprise a first test point interface 26 and a second test point interface 28. The first test point interface 26 and the second test point interface 28 are connected to different parts of the signal chain 18, e.g. provided at different locations of the signal chain 18.

In an embodiment, the test and/or measurement instrument 10 may have a first operation mode and a second operation mode, which can be manually selected by the user or automatically set based on a test procedure performed. In the first operation mode, the first test point interface 26 is connected with the clock recovery circuit 12 via the multiplexer 14, whereas the second test point interface 28 is not connected with the clock recovery circuit 12. In the second operation mode, the second test point interface 28 is connected with the clock recovery circuit 12 via the multiplexer 14, whereas the first test point interface 26 is not connected with the clock recovery circuit 12.

Hence, the electrical signal to be forwarded to the clock recovery circuit 12 via the multiplexer 14 can be obtained from different locations of the signal chain 18, which depends on the operation mode, Additionally, the test and/or measurement instrument 10 may comprise a first equalizer 30 and a second equalizer 32, wherein the second equalizer 32 is located downstream of the first equalizer 30 and wherein the first test point interface 26 is connected upstream of the first equalizer 30. The second test point interface 28 is connected downstream of the first equalizer 30. Further, the second test point interface 28 is connected upstream of the second equalizer 32.

Accordingly, it can be chosen if the electrical signal should be tapped for clock recovery upstream or downstream of the first equalizer 30 in the signal chain 18. For instance, the user may choose where the electrical signal should be tapped from. As indicated above, the respective tapping location may be associated with the operation mode of the test and/or measurement instrument 10.

Generally, the at least two test point interfaces 16 may comprise at least three test point interfaces 16 or at least four test point interfaces 16, to which the multiplexer 14 is connected such that each test point interface 16 is selectively connectable to the clock recovery circuit 12 via the multiplexer 14 for real-time performance analysis.

In the embodiment shown in FIG. 1, four test point interfaces 16 are provided. Any of the test point interfaces 16 can be connected to the clock recovery circuit 12 selectively, regardless of which test point interface 16 is used for tapping the electrical signal (the waveform) itself for the performance analysis. Therefore, in the case of four test point interfaces 16, the user can choose from 16 available combinations.

In an embodiment, a third test point interface 34 is connected downstream of the second equalizer 32. The electrical signal can thus be tapped downstream of the second equalizer 32 for clock recovery and/or for using the signal itself (its waveform) for the performance analysis.

As shown in FIG. 1, the test and/or measurement instrument 10 may comprise at least three equalizers 20, wherein the second equalizer 32 is located downstream of the first equalizer 30 and wherein a third equalizer 36 is provided that is located downstream of the second equalizer 32. In particular, the third test point interface 34 is connected upstream of the third equalizer 36.

Additionally, a fourth test point interface 44 connected downstream of the third equalizer 36 is provided in the shown embodiment. The electrical signal can thus be tapped downstream of the third equalizer 36 for clock recovery and/or for using the signal itself (its waveform) for the performance analysis.

In general, the plurality of equalizers 20 may comprise at least one of a continuous time linear equalizer, a feed forward equalizer, or a decision feedback equalizer. In the embodiment shown in FIG. 1, the first equalizer 30 is a continuous time linear equalizer and the second equalizer 32 is a feed forward equalizer.

In an embodiment, the plurality of equalizers 20 may comprise a feed forward equalizer with coefficients selected such that the feed forward equalizer's behavior is equivalent to that of a decision feedback equalizer. An equalization can thus be performed to the electrical signal that is equivalent to an equalization via a decision feedback equalizer.

In the embodiment shown in FIG. 1, the third equalizer 36 is a decision feedback equalizer. As depicted, the decision feedback equalizer may comprise an adder 38, a slicer 40 provided downstream of the adder 38, and a feedback filter 42 provided downstream of the slicer 40 and connected to the adder 38. In particular, the slicer 40 is connected to the clock recovery circuit 12 such that eye pattern acquisition is enabled. Thus, the electrical signal can be monitored for signal distortion.

In an embodiment, the slicer 40 is configured for making symbol decisions. The decoded symbols are to be fed into the feedback filter 42, which provides its output to the adder 38. The fourth test point interface 44 may be connected to the signal chain 18 downstream of the adder 38 and upstream of the slicer 40.

Alternatively, the third equalizer 36 may be a feed forward equalizer with coefficients selected such that its behavior is equivalent to that of a decision feedback equalizer.

In an embodiment, the equalizers 20 may be real-time equalizers 20. The test and/or measurement instrument 10 can thus perform the equalization of the electrical signal in real time. In addition, the multiplexer 14 may be a real-time multiplexer 14. Moreover, the clock recovery circuit 12 may be a real-time clock recovery circuit 12. The clock recovery circuit 12 may be made of a hardware means (e.g., analog and/or digital circuitry, etc.). Additionally and/or alternatively, the multiplexer 14 may be made of a hardware means, for example without any software running thereon.

Accordingly, real-time performance analysis, e.g. eye pattern generation of jitter analysis, can be enabled. In an embodiment, real-time clock recovery can be enabled. In particular, the clock recovery circuit 12 is operated without any software running thereon.

As depicted in the embodiment shown in FIG. 1, the test and/or measurement instrument 10 may further comprise an acquisition and/or display circuit 46. In an embodiment, the acquisition and/or display circuit 46 is connected downstream of the fourth equalizer 40 in the signal chain 18. Hence, acquisition and/or display of the equalized electrical signal can be enabled.

Figure 2:
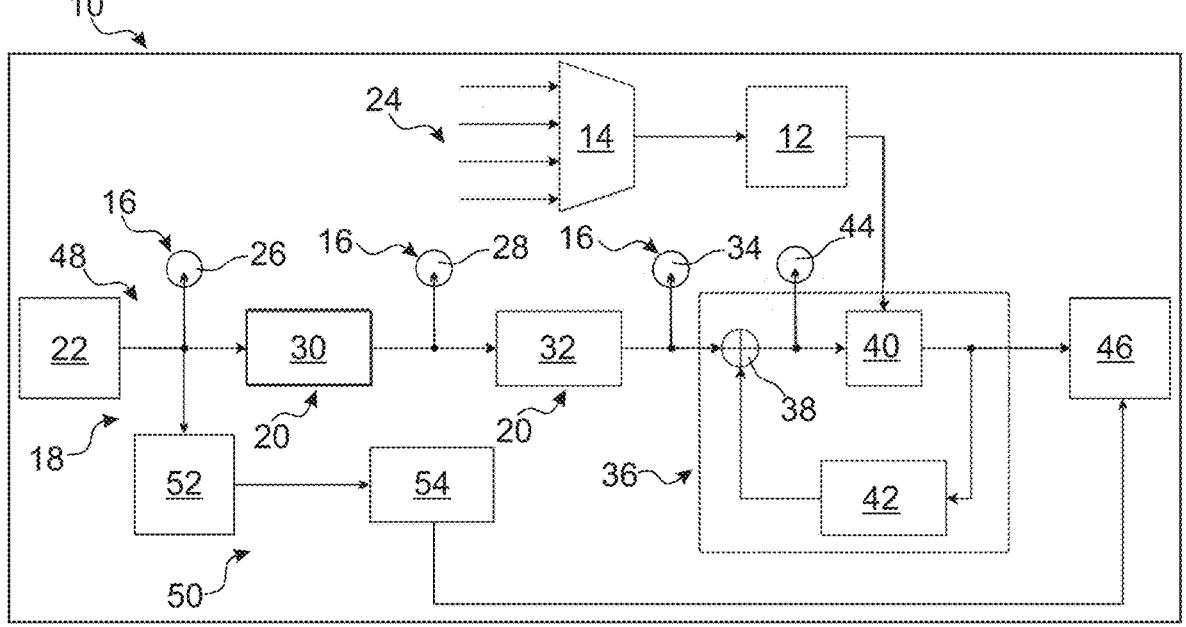
FIG. 2 is a block diagram schematically illustrating a test and/or measurement instrument according to another embodiment of the present disclosure.

FIG. 2 is a block diagram schematically illustrating a test and/or measurement instrument 10 according to another embodiment of the present disclosure. Henceforth, only the differences with respect to the embodiment shown in FIG. 1 are described. For the remaining features, the description above regarding FIG. 1 is referred to.

As shown in FIG. 2, the signal chain 18 of the test and/or measurement instrument 10 may comprise a real-time path 48 (similar to the embodiment according to FIG. 1) and, additionally, a post-processing path 50. Therein, the clock recovery circuit 12 is provided in the real-time path 48.

In an embodiment, at least one real-time equalizer 20 is provided in the real-time path 48. In the depicted example, the first equalizer 30, the second equalizer 32, and the third equalizer 36 are real-time equalizers 20. Accordingly, clock recovery can be performed in real time, including the equalization chosen to be performed on the signal to be used for clock recovery.

In an embodiment, the test and/or measurement instrument 10 may be configured to store an acquired waveform without equalization in an acquisition storage 52, wherein at least one post-processing equalizer 54 configured for processing the waveform is provided in the post-processing path 50. Hence, more complex equalization can be implemented in the post-processing path 50, for example equalization that cannot be implemented in the real-time path 48.

Certain embodiments disclosed herein include systems, apparatus, modules, units, devices, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations or hardware means (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implementing the functionality described herein.

In an embodiment, one or more of the components of the test and/or measurement instrument 10 referenced above includes circuitry programmed to carry out one or more functions disclosed herein. In an embodiments, one or more computer-readable media associated with or accessible by such circuitry contains computer readable instructions embodied thereon that, when executed by such circuitry, cause the component or circuitry to perform one or more functions disclosed herein.

In an embodiment, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In an embodiment, computer-readable media is any medium that stores computer readable instructions, or other information non-transitorily and is directly or indirectly accessible to a computing device, such as processor circuitry, etc., or other circuitry disclosed herein etc. In other words, a computer-readable medium is a non-transitory memory at which one or more computing devices can access instructions, codes, data, or other information. As a non-limiting example, a computer-readable medium may include a volatile random access memory (RAM), a persistent data store such as a hard disk drive or a solid-state drive, or a combination thereof. In an embodiment, memory can be integrated with a processor, separate from a processor, or external to a computing system.

Accordingly, in an embodiment, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the functions and/or methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test and/or measurement instrument for measuring an electrical signal, wherein the test and/or measurement instrument comprises a clock recovery circuit, a multiplexer, at least two test point interfaces, and a signal chain comprising a plurality of equalizers, wherein the test point interfaces are connected to different parts of the signal chain, and wherein the multiplexer is connected to the clock recovery circuit and to the test point interfaces such that each test point interface is selectively connectable to the clock recovery circuit via the multiplexer for real-time performance analysis.

2. The test and/or measurement instrument according to claim 1, wherein the test point interfaces are connected to the clock recovery circuit in a flexible manner via the multiplexer.

3. The test and/or measurement instrument according to claim 1, wherein the at least two test point interfaces comprise a first test point interface and a second test point interface, wherein the test and/or measurement instrument further comprises a first operation mode and a second operation mode, wherein, in the first operation mode, a first test point interface is connected with the clock recovery circuit via the multiplexer and a second test point interface is not connected with the clock recovery circuit, and wherein, in the second operation mode, the second test point interface is connected with the clock recovery circuit via the multiplexer and the first test point interface is not connected with the clock recovery circuit.

4. The test and/or measurement instrument according to claim 1, wherein the at least two test point interfaces comprises a first test point interface and a second test point interface, wherein a first equalizer and a second equalizer are provided, wherein the second equalizer is located downstream of the first equalizer, wherein the first test point interface is connected upstream of the first equalizer, and wherein the second test point interface is connected downstream of the first equalizer.

5. The test and/or measurement instrument according to claim 4, wherein the at least two test point interfaces comprise a third test point interface that is connected downstream of the second equalizer.

6. The test and/or measurement instrument according to claim 1, wherein the at least two test point interfaces comprise at least three test point interfaces or at least four test point interfaces, to which the multiplexer is connected such that each test point interface is selectively connectable to the clock recovery circuit via the multiplexer for real-time performance analysis.

7. The test and/or measurement instrument according to claim 1, comprising at least three equalizers, wherein a second equalizer is located downstream of a first equalizer, wherein a third equalizer is provided that is located downstream of the second equalizer, wherein a first test point interface is connected upstream of the first equalizer, wherein a second test point interface is connected downstream of the first equalizer and wherein the second test point interface is connected upstream of the third equalizer.

8. The test and/or measurement instrument according to claim 7, wherein a fourth test point interface is connected downstream of the third equalizer.

9. The test and/or measurement instrument according to claim 7, wherein the third equalizer is a decision feedback equalizer or wherein the third equalizer is a feed forward equalizer with coefficients selected such that its behavior is equivalent to that of a decision feedback equalizer.

10. The test and/or measurement instrument according to claim 1, wherein the plurality of equalizers comprises at least one of a continuous time linear equalizer, a feed forward equalizer, or a decision feedback equalizer.

11. The test and/or measurement instrument according to claim 1, wherein the plurality of equalizers comprises a feed forward equalizer with coefficients selected such that the feed forward equalizer's behavior is equivalent to that of a decision feedback equalizer.

12. The test and/or measurement instrument according to claim 1, wherein each of the equalizers is configured such that it can be individually deactivated or bypassed.

13. The test and/or measurement instrument according to claim 1, wherein the signal chain further comprises a slicer connected to the clock recovery circuit such that eye pattern acquisition is enabled.

14. The test and/or measurement instrument according to claim 1, wherein the equalizers are real-time equalizers.

15. The test and/or measurement instrument according to claim 1, wherein the multiplexer is a real-time multiplexer and/or wherein the clock recovery circuit is a real-time clock recovery circuit.

16. The test and/or measurement instrument according to claim 1, wherein the clock recovery circuit is made of a hardware means and/or wherein the multiplexer is made of a hardware means.

17. The test and/or measurement instrument according to claim 1, wherein the signal chain comprises a real-time path and a post-processing path and wherein the clock recovery circuit and at least one real-time equalizer are provided in the real-time path.

18. The test and/or measurement instrument according to claim 17, wherein the test and/or measurement instrument is configured to store an acquired waveform without equalization in an acquisition storage and wherein at least one post-processing equalizer configured for processing the acquired waveform is provided in the post-processing path.

19. The test and/or measurement instrument according to claim 1, wherein the test and/or measurement instrument is an oscilloscope configured for emulating a receiver.

20. The test and/or measurement instrument according to claim 19, wherein the emulated receiver is a serial communication data receiver.

\* \* \* \* \*